(12) United States Patent
Lai

(10) Patent No.: US 12,176,889 B2
(45) Date of Patent: Dec. 24, 2024

(54) INTEGRATED CIRCUITS EMPLOYING ALWAYS-ON WATCHDOG TIMER FOR PROVIDING REGULAR POWER RESET

(71) Applicant: Realtek Semiconductor Corp., HsinChu (TW)

(72) Inventor: Te-Lun Lai, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 34 days.

(21) Appl. No.: 18/201,150

(22) Filed: May 23, 2023

(65) Prior Publication Data

US 2024/0120915 A1    Apr. 11, 2024

(30) Foreign Application Priority Data

Oct. 7, 2022  (TW) .................................. 111138126

(51) Int. Cl.
| | | |
|---|---|---|
| *G06F 1/32* | (2019.01) | |
| *G06F 1/24* | (2006.01) | |
| *G06F 1/3203* | (2019.01) | |
| *H03K 17/22* | (2006.01) | |
| *H03K 19/20* | (2006.01) | |

(52) U.S. Cl.
CPC .............. *H03K 17/22* (2013.01); *G06F 1/24* (2013.01); *G06F 1/3203* (2013.01); *H03K 19/20* (2013.01)

(58) Field of Classification Search
CPC ........ H03K 17/22; H03K 17/30; H03K 17/94; H03K 19/0175; H03K 19/20; G06F 1/24; G06F 1/26; G06F 1/32; G06F 1/3203; G06F 1/3206; G06F 1/3212
See application file for complete search history.

(56) References Cited

U.S. PATENT DOCUMENTS

| 6,492,862 B2 * | 12/2002 | Nakahara | ................ H02M 3/07 327/536 |
|---|---|---|---|
| 7,876,144 B2 * | 1/2011 | Hashimoto | ................ G06F 1/28 327/296 |
| 2018/0113764 A1 | 4/2018 | Bhandari | |

FOREIGN PATENT DOCUMENTS

CN           204203679 U       3/2015

* cited by examiner

*Primary Examiner* — Long Nguyen
(74) *Attorney, Agent, or Firm* — Winston Hsu

(57) ABSTRACT

An integrated circuit includes a power-on reset (POR) circuit, a watchdog timer, a first AND gate and a power management control circuit. The POR circuit is used to receive an input voltage to generate a POR signal and generate a clock signal. The watchdog timer is used to generate a timeout signal according to the clock signal when the POR signal has an enabling voltage, the clock signal enabling generation of timeout pulses in the timeout signal at predetermined time intervals. The first AND gate including a first input terminal for receiving the POR signal; a second input terminal for receiving the timeout signal; and an output terminal for outputting a reset signal according to the POR signal and the timeout signal. The power management control circuit is used to reset an output current in response to a reset pulse in the reset signal.

12 Claims, 5 Drawing Sheets

INTEGRATED CIRCUITS EMPLOYING ALWAYS-ON WATCHDOG TIMER FOR PROVIDING REGULAR POWER RESET

BACKGROUND OF THE INVENTION

1. Field of the Invention

The present invention relates to electronic circuits, and in particular, to integrated circuits employing an always-on watchdog timer for providing regular power reset.

2. Description of the Prior Art

An electrical device is a device powered by a battery or a power switcher. When the supply voltage drops quickly owing to low power of the battery or the supply voltage is unstable owing to switching noise in the power adapter, a system crash might occur in the electrical device. In events as such, the electrical device needs to be reset to allow a continuous operation of the electrical device.

In the related art, an external reset circuit or an internal brown-out detection (BOD) circuit is included to the electrical device to resolve the issue of voltage instability. However, the use of the external reset circuit increases manufacturing costs, and the use of the internal BOD circuit results in a dead zone for voltage detection owing to process differences, leading to inaccurate detection of the low input voltage. FIG. 5 shows a schematic diagram of the dead zone of the conventional BOD circuit, where the horizontal axis represents time t and the vertical axis represents voltage V. Vbod is an ideal detection threshold of the BOD circuit. The actual detection threshold of the BOD circuit may be located between the high detection threshold Vbodh and the low detection threshold Vbodl owing to the process variations, and the voltages between the ideal detection threshold Vbod and the low detection threshold Vbodl are referred to as a dead zone 5. For example, if the ideal detection threshold Vbod may be 2.5V, the high detection threshold Vbodh may be 2.6V and the low detection threshold Vbodl may be 2.3V, the dead zone 5 may range between 2.5V and 2.3V. If the actual detection threshold of the BOD circuit is the low detection threshold Vbodl, the BOD circuit is unable to detect a low value of the input voltage Vin when the input voltage Vin falls into the dead zone 5, resulting in inaccurate reset of the electrical device.

SUMMARY OF THE INVENTION

According to an embodiment of the invention, an integrated circuit includes a power-on reset (POR) circuit, a watchdog timer, a first AND gate and a power management control circuit. The POR circuit is used to receive an input voltage to generate a power-on reset signal and generate a clock signal. The watchdog timer is coupled to the POR circuit, and is used to generate a timeout signal according to the clock signal when the power-on reset signal has an enabling voltage, the clock signal enabling generation of timeout pulses in the timeout signal at predetermined time intervals. The first AND gate including a first input terminal coupled to the POR circuit and used to receive the power-on reset signal; a second input terminal coupled to the watchdog timer and used to receive the timeout signal; and an output terminal used to output a reset signal according to the power-on reset signal and the timeout signal. The power management control circuit is coupled to the first AND gate, and is used to reset an output current in response to a reset pulse in the reset signal.

According to another embodiment of the invention, an integrated circuit includes a power-on reset (POR) circuit, a brown-out detection (BOD) circuit, a watchdog timer, a first AND gate, a second AND gate and a power management control circuit. The POR circuit is used to receive an input voltage to generate a power-on reset signal and generate a clock signal. The BOD circuit is used to receive the input voltage to generate a BOD signal. The second AND gate including a first input terminal coupled to the power-on reset circuit and used to receive the power-on reset signal; a second input terminal coupled to the BOD circuit and used to receive the BOD signal; and an output terminal used to output an enabling signal according to the power-on reset signal and the BOD signal. The watchdog timer is coupled to the second AND gate, and is used to generate a timeout signal according to the clock signal when the enabling signal has an enabling voltage, the clock signal enabling generation of timeout pulses in the timeout signal at predetermined time intervals. The first AND gate including a first input terminal coupled to the second AND gate and used to receive the enabling signal; a second input terminal coupled to the watchdog timer and used to receive the timeout signal; and an output terminal used to output a reset signal according to the enabling signal and the timeout signal. The power management control circuit is coupled to the first AND gate, and is used to reset an output current in response to a reset pulse in the reset signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
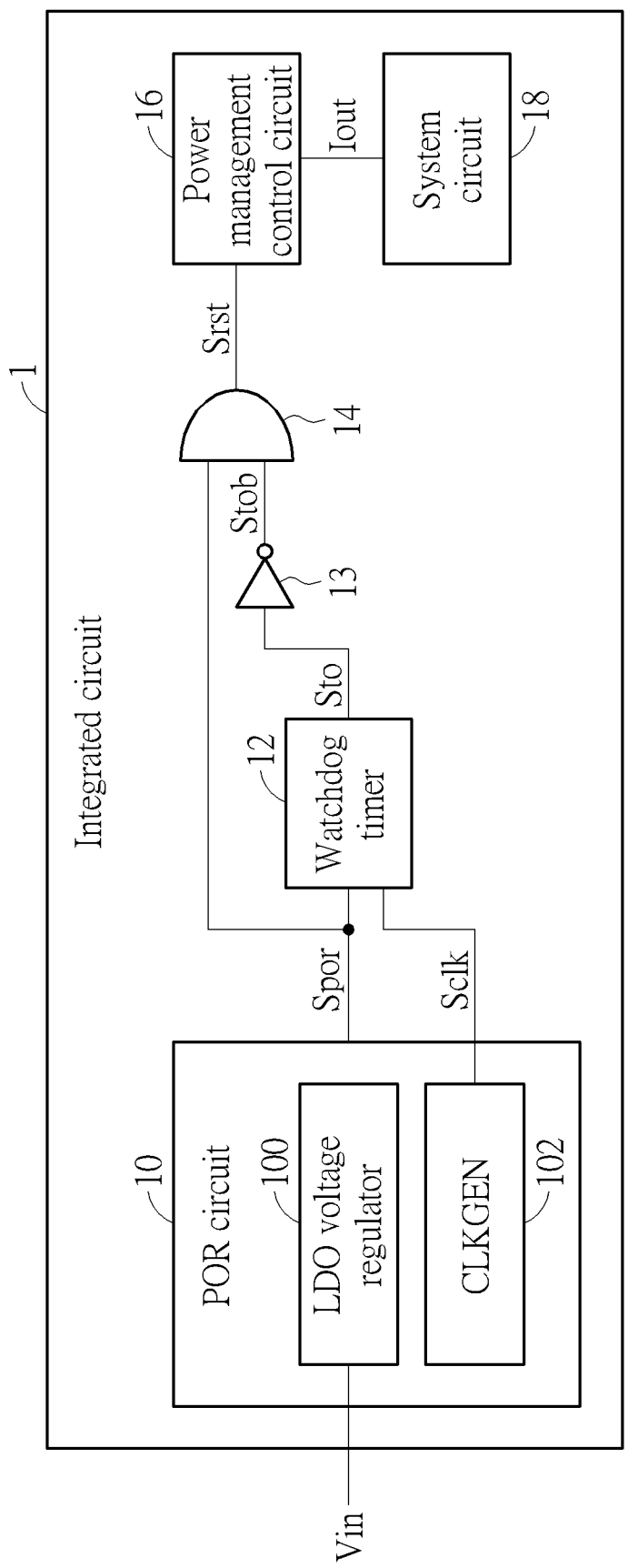
FIG. 1 is a schematic diagram of an integrated circuit according to an embodiment of the invention.

FIG. 1 is a schematic diagram of an integrated circuit 1 according to an embodiment of the invention. The integrated circuit 1 may be any type of chips. For example, the integrated circuit 1 may be a processing chip, a communication chip, a network chip, a home appliance control chip, a display control chip, or other types of chips. In some embodiments, the integrated circuit 1 may be a standalone chip operating independently without being connected to an external circuit. In some other embodiments, the integrated circuit 1 may be a non-standalone chip that is connected to an external circuit to operate. The external circuit may be a microcontroller unit (MCU). The integrated circuit 1 may include an always-on watchdog timer (AON WDT) to perform voltage reset on the integrated circuit 1 at regular intervals, ensuring that the integrated circuit 1 can automatically perform the voltage reset without an external reset circuit or manual reset upon detecting voltage instability or a human error or entering the power saving mode, saving manufacturing costs while achieving a system restart. For example, the control chip of a sweeping robot may be realized by the integrated circuit in the embodiment of the present invention. If a system crash occurs in the sweeping robot owing to voltage instability or human errors, since the watchdog timer continuously resets the system voltage at intervals, the sweeping robot may be rebooted without manually resetting the power.

The integrated circuit 1 may include a power-on reset (POR) circuit 10, a watchdog timer 12, an inverter 13, a first AND gate 14, a power management control circuit 16 and a system circuit 18. The watchdog timer 12 may be coupled to the POR circuit 10. The inverter 13 includes an input terminal coupled to the watchdog timer 12; and an output terminal coupled to the second input terminal of the first AND gate 14. The first AND gate 14 includes a first input terminal coupled to the POR circuit 10; a second input terminal coupled to the watchdog timer 12 via the inverter 13; and an output terminal. The power management control circuit 16 may be coupled to the first AND gate 14. The system circuit 18 may be coupled to the power management control circuit 16.

The POR circuit 10 may receive an input voltage Vin to generate a POR signal Spor and a clock signal Sclk. The input voltage Vin may be 3.3V, and may be provided by an external power source of the integrated circuit 1, and the external power source may be a battery or a power switcher. The POR circuit 10 may switch the POR signal Spor to an enabling voltage when the input voltage Vin exceeds a high POR voltage level, and switch the POR signal Spor to a disabling voltage when the input voltage Vin is less than the low POR voltage level. The high POR voltage level may be higher than the low POR voltage level. In some embodiments, the high POR voltage level may be 2.4V, and the low POR voltage level may be 0.5V. If the POR signal Spor is an active high signal, the enabling voltage may be a high voltage, such as 0.9V, and the disabling voltage may be a low voltage, such as 0V. If the POR signal Spor is an active low signal, the enabling voltage may be a low voltage, and the disabling voltage may be a high voltage. details are provided in the following paragraphs with the POR signal Spor being an active-high signal. The POR circuit 10 may include a low dropout (LDO) voltage regulator 100 and a clock generator (CLKGEN) 102. The LDO voltage regulator 100 may step down the input voltage Vin to generate a supply voltage, for example, the supply voltage may be 0.9V±10%. The clock generator 102 may generate the clock signal Sclk. In some embodiments, the clock generator 102 may receive a reference clock signal from a crystal oscillator external to the integrated circuit 1, and perform filtering, amplification and frequency conversion on the reference clock signal to generate the clock signal Sclk. In other embodiments, the clock generator 102 may include a voltage-controlled oscillator and a phase-locked loop to generate the clock signal Sclk. The POR circuit 10 may use the supply voltage to supply power to the watchdog timer 12, the inverter 13, the first sum gate 14 and the power management control circuit 16, and may transmit the clock signal Sclk to the watchdog timer 12. The supply voltage and the clock signal Sclk may be provided steadily to the watchdog timer 12, the inverter 13, the first AND gate 14 when the integrated circuit 1 receiving the input voltage Vin, for example, in a boot mode, a normal operation mode and a power saving mode, so the watchdog timer 12, the inverter 13, the first AND gate 14 and the power management control circuit 16 may be continuously operated in the boot mode, the normal operation mode and the power saving mode.

The watchdog timer 12 may generate a timeout signal Sto according to the clock signal Sclk when the POR signal Spor has the enabling voltage, the clock signal Sclk enabling generation of timeout pulses in the timeout signal Sto at predetermined time intervals. For example, if the predetermined time interval is 5 seconds, the watchdog timer 12 may expire and reset every 5 seconds, and may output a timeout pulse every 5 seconds. The timeout pulse may be a positive pulse. The input terminal of the inverter 13 may receive the timeout signal Sto, and the output terminal of the inverter 13 may output an inverted signal Stob of the timeout signal Sto. The first input terminal of the first AND gate 14 may receive the POR signal Spor, the second input terminal of the first AND gate 14 may receive the inverted signal Stob, and the output terminal of the first AND gate 14 may output a reset signal Srst according to the POR signal Spor and the inverted signal Stob. Reset pulse in the reset signal Srst may be negative pulses for resetting the power management control circuit 16, enabling the power management control circuit 16 to reset an output current Iout to the system circuit 18 for power supply. The system circuit 18 may be an analog circuit, a digital circuit or a mixed signal circuit. In some embodiments, when the output current Iout is reset, the power management control circuit 16 may further reset the output voltage upon receiving a reset pulse, so as to maintain the output voltage at a stable level, and output the output voltage to the system circuit 18.

Figure 2:
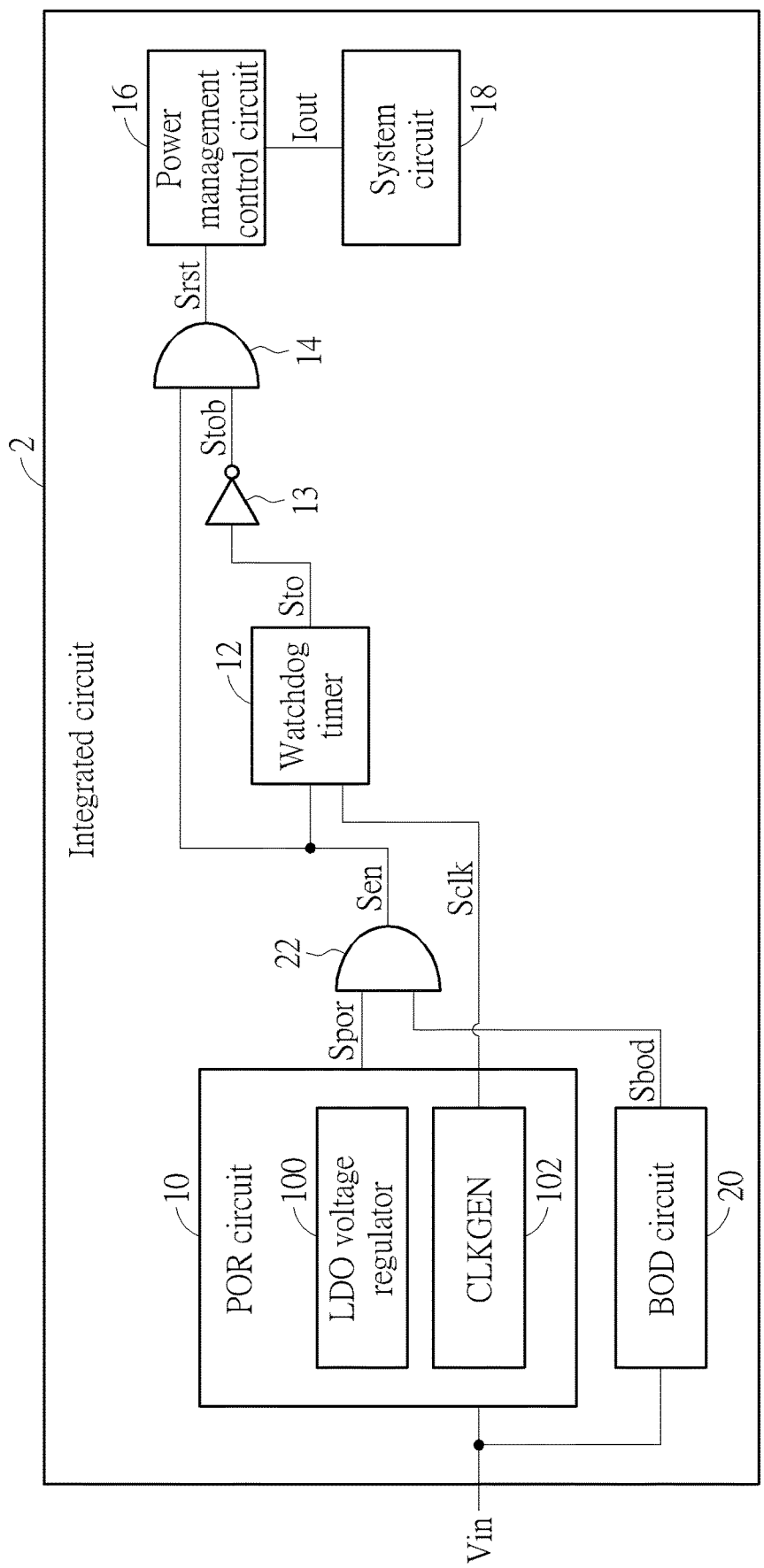
FIG. 2 is a schematic diagram of an integrated circuit according to another embodiment of the invention.

FIG. 2 is a schematic diagram of an integrated circuit 2 according to another embodiment of the invention. The main difference between the integrated circuit 2 and the integrated circuit 1 lies in is that the integrated circuit 2 further includes a brown-out detection (BOD) circuit 20 and a second AND gate 22, and the connection of the first AND gate 14 is different. The differences between the integrated circuit 2 and the integrated circuit 1 are explained as follows.

The second AND gate 22 includes a first input terminal coupled to the POR circuit 10; a second input terminal coupled to the BOD circuit 20; and an output terminal. The first AND gate 14 includes a first input terminal coupled to the output terminal of the second AND gate 22; a second input terminal coupled to the output terminal of the inverter 13; and an output terminal. The POR circuit 10 may further provide the supply voltage to the BOD circuit 20 and the second sum gate 22, so that the BOD circuit 20 and the second sum gate 22 may be continuously operated in the boot mode, the normal operation mode and the power saving mode.

The BOD circuit 20 may switch the BOD signal Sbod to the enabling voltage when the input voltage Vin exceeds the high detection voltage level, and switch the BOD signal Sbod to the disabling voltage when the input voltage Vin is less than a low detection voltage level. The high POR voltage level may be higher than the low POR voltage level. Details are provided in the following paragraphs with the BOD signal Sbod being an active-high signal. The first input terminal of the second AND gate 22 may receive the POR signal Spor, the second input terminal of the second AND gate 22 may receive the BOD signal Sbod, and the output terminal of the second AND gate 22 may output an enabling signal Sen according to the POR signal Spor and the BOD signal Sbod. Therefore, if both the BOD signal Sbod and the POR signal Spor are at the enabling voltage, the second AND gate 22 may set the enabling signal Sen to the enabling voltage. If at least one of the BOD signal Sbod and the POR signal Spor is at the disabling voltage, the second AND gate 22 may set the enabling signal Sen to the disabling voltage. In some embodiments, the high detection voltage level may be 2.65V, the low detection voltage level may be 2.5V, the high POR voltage level may be 2.4V, and the low POR voltage level may be 0.5V, and thus, the second AND gate 22 may set the enabling signal Sen to the enabling voltage when the input voltage Vin exceeds 2.65V, and set the enabling signal Sen to the disabling voltage when the input voltage Vin is less than 2.5V.

In the integrated circuit 2, the enabling signal Sen instead of the POR signal Spor is fed to the first input terminal of the first AND gate 14, for the output terminal of the first AND gate 14 to output the reset pulse according to the enabling signal Sen and an inverted pulse of the reset pulse. The connection and operation methods of other circuit components may be found from the preceding paragraphs, and will not be repeated here for brevity.

Figure 3:
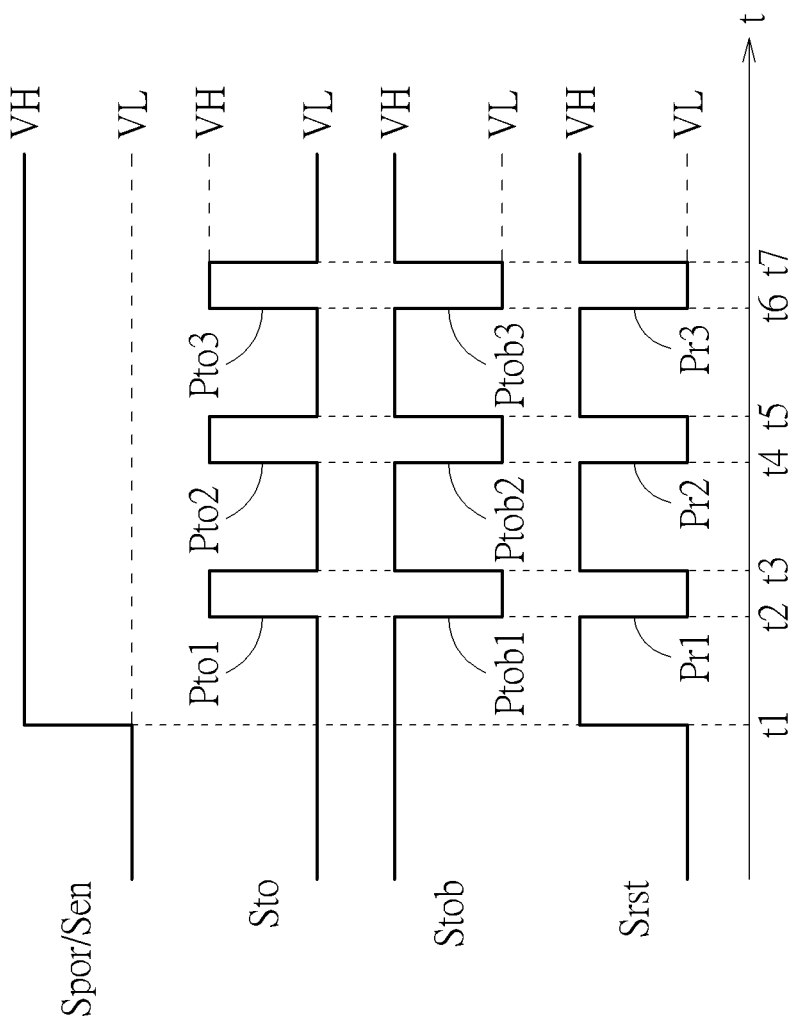
FIG. 3 is a timing diagram of the integrated circuit in FIG. 1 or FIG. 2.

FIG. 3 is a timing diagram of the integrated circuit 1 or the integrated circuit 2, showing waveforms of the POR signal Spor and/or the enabling signal Sen, the timeout signal Sto, the inverted signal Stob, and the reset signal Srst.

At Time t1, the POR signal Spor and/or the enabling signal Sen are switched from a low voltage VL (the disabling voltage) to a high voltage VH (the enabling voltage), the watchdog timer 12 starts counting the predetermined time interval, and the timeout signal Sto Maintained at the low voltage VL, the inverted signal Stob is maintained at the high voltage VH, and the reset signal Srst is switched from the low voltage VL to the high voltage VH.

At Time t2, the POR signal Spor and/or the enabling signal Sen are maintained at the high voltage VH, the watchdog timer 12 expires and is reset to recount the predetermined time interval, and the timeout signal Sto is switched from the low voltage VL to the high voltage VH to form the rising edge of a timeout pulse Pto1, the inverted signal Stob is switched from the high voltage VH to the low voltage VL to form the falling edge of an inverted pulse Ptob1, and the reset signal Srst is switched from the high voltage VH to the low voltage VL to form the falling edge of a reset pulse Pr1. The time difference (t2−t1) between Time t2 and Time t1 is the predetermined time interval counted by the watchdog timer 12, and may be, for example, 5 seconds.

At Time t3, the POR signal Spor and/or the enabling signal Sen are maintained at the high voltage VH, the timeout signal Sto is switched from the high voltage VH to the low voltage VL to form the falling edge of the timeout pulse Pto1, and the inverted signal Stob is switched from the low voltage VL to the high voltage VH to form the rising edge of the inverse pulse Ptob1, and the reset signal Srst is switched from the low voltage VL to the high voltage VH to form the rising edge of the reset pulse Pr1. The time difference (t3−t2) between the Time t3 and the Time t2 is the preset pulse width of the timeout pulse Pto1, for example, 1 second.

The waveforms from Time t3 to Time t5 and the waveforms from Time t5 to Time t7 repeat the waveforms from Time t1 to Time t3, and the explanations therefor are omitted for brevity. The integrated circuit 1 generates a reset pulse Pr2 and a reset pulse Pr3 between Time t4 and Time t5 and between Time t6 and Time t7, respectively. The time difference (t4−t2) between the falling edge of reset pulse Pr2 and the falling edge of reset pulse Pr1 and the time difference (t6−t4) between the falling edge of reset pulse Pr3 and the falling edge of reset pulse Pr2 are equal to the predetermined time interval counted by the watchdog timer 12. The pulse width (t3−t2) of the reset pulse P1, the pulse width (t5−t4) of the reset pulse P2 and the pulse width (t7−t6) of the reset pulse P3 may be equal. The power management control circuit 16 may reset the output current Iout in response to the reset pulses Pr1, Pr2, and Pr3, that is, reset the output current Iout between Time t2 and Time t3, between Time t4 and Time t5, and between Time t6 and Time t7, so as to reset the output current Iout at regular time intervals.

Figure 4:
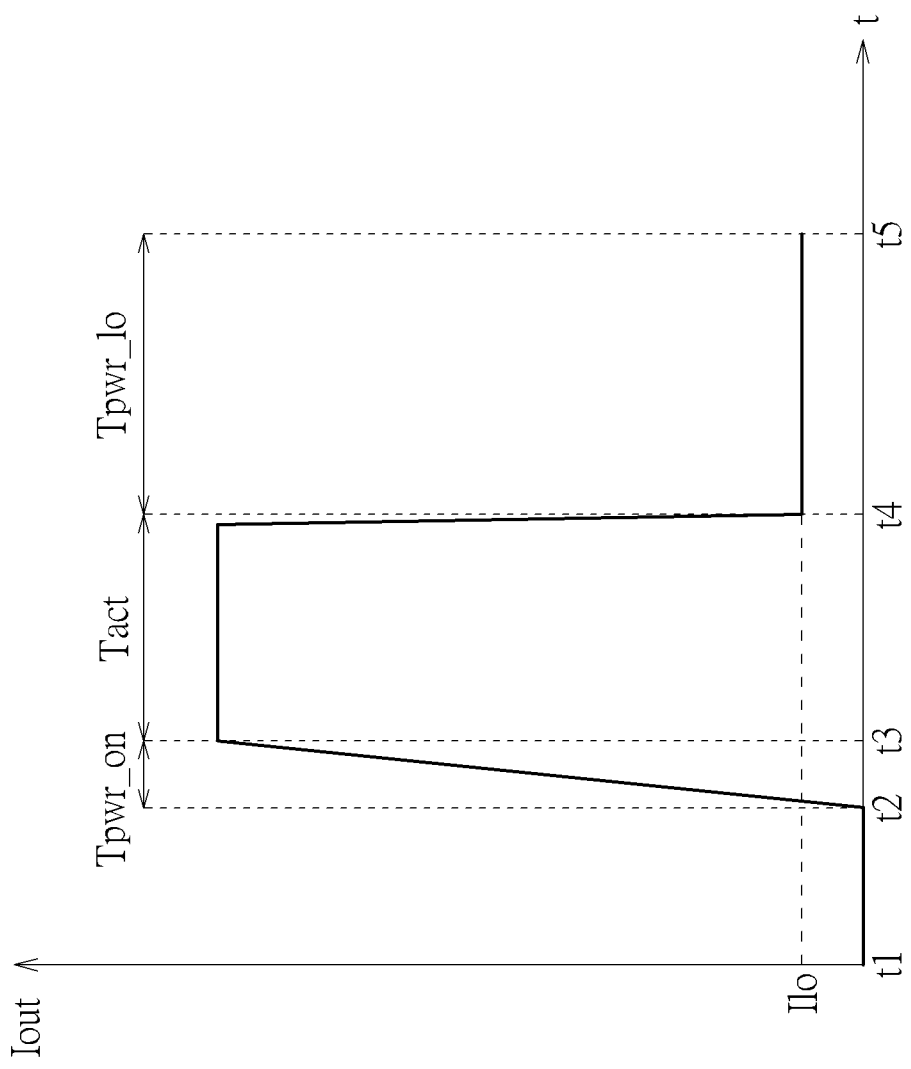
FIG. 4 is a schematic diagram of an operation mode of the integrated circuit in FIG. 1 or FIG. 2.
Figure 5:
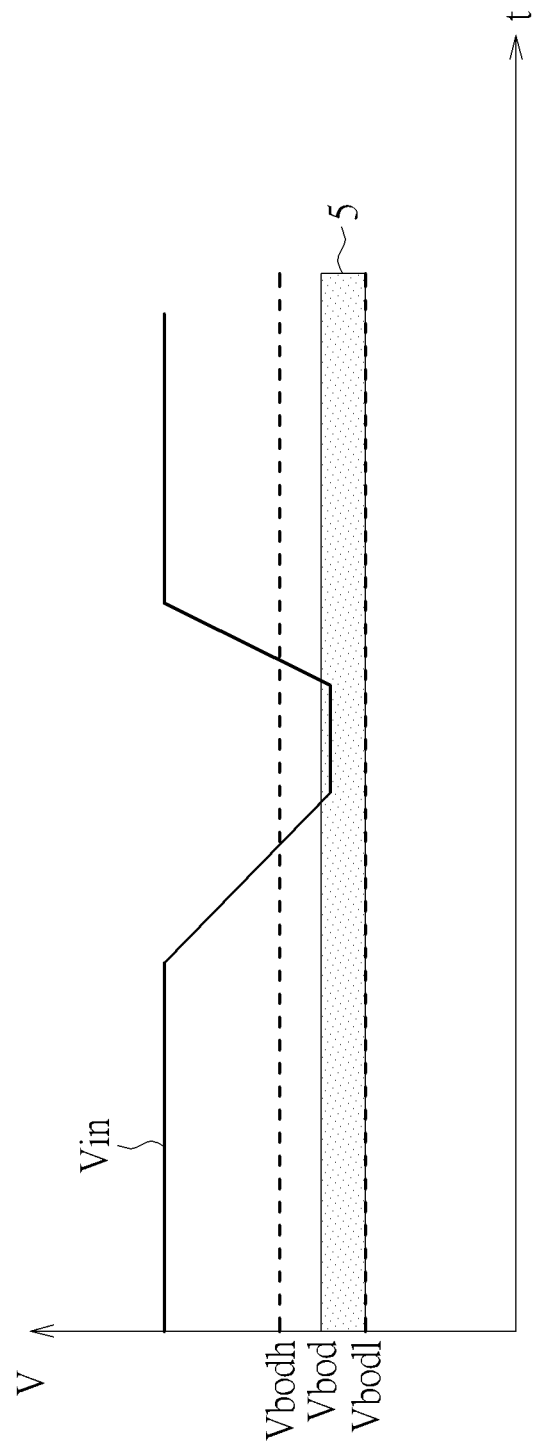
FIG. 5 shows a schematic diagram of a dead zone of a conventional brown-out detection circuit.

FIG. 4 is a schematic diagram of the operation mode of the integrated circuit 1 or the integrated circuit 2, wherein the vertical axis represents the output current Iout, and the horizontal axis represents time t.

At Time t1, the integrated circuit 1 or the integrated circuit 2 is not powered on, and the output current Iout is 0A. At Time t2, the integrated circuit 1 or the integrated circuit 2 is turned on, and the output current Iout starts to increase from 0A. Between Time t2 and Time t3, the output current Iout rises from 0A to a normal operating current level. The interval between Time t2 and Time t3 may be referred to as a power-on period Tpwr_on. During the power-on period Tpwr_on, the system circuit 18 may remain inoperable.

At Time t3, the output current Iout reaches the normal operating current level. Between Time t3 and Time t4, the output current Iout is maintained at the normal operating current level. The interval between Time t3 and Time t4 may be referred to as a normal operation period Tact. During the normal operation period Tact, the system circuit 18 may operate in the normal operation mode, providing all circuit functions.

At Time t4, the output current Iout drops to a power saving current level Ilo. For example, the power-saving current level Ilo may be 20 uA. Between Time t4 and Time t5, the output current Iout is maintained at the power-saving current level Ilo. The period between Time t4 to Time t5 may be referred to as a power saving period Tpwr_lo. During the power-saving period Tpwr_lo, the system circuit 18 may operate in the power-saving mode (also referred to as a sleep mode or a low-power mode), turning off all unnecessary internal circuits (such as an oscillator and a phase-locked loop) in the system circuit 18, and providing only certain necessary circuit functions (such as the wake-up function).

When enabled, the watchdog timer 12 may output current Iout during the boot mode, the normal operation mode and the power saving mode to ensure that the integrated circuit 1 or the integrated circuit 2 can automatically perform the voltage reset without an external reset circuit or manual reset upon detecting voltage instability or a human error or entering the power saving mode, saving manufacturing costs while achieving a system restart. In some embodiments, the output voltage may be reset to maintain a stable level during the power-on mode, the normal operation mode and the power-saving mode, so as to generate the output current Iout.

Although the reset pulses in the reset signal Srst in the integrated circuits 1 and 2 are negative pulses, those skilled in the art would recognize that the inverter 13 may be omitted according to the actual design requirements, so as to generate positive pulses as the reset pulses in the reset signal Srst. In some embodiments, the integrated circuit 1 or the integrated circuit 2 may also be externally connected to an external control circuit (such as a microcontroller unit), and outputs the reset signal Srst to the external control circuit to notify the external control circuit via a general-purpose input and output (GPIO) pin to perform voltage reset or other operations. In some embodiments, the integrated circuit 1 or the integrated circuit 2 may further disable the watchdog timer 12 after the input voltage Vin stabilizes, saving power and achieving system stability.

The integrated circuits 1 and 2 use the watchdog timer 12 to continuously and regularly reset the output current Iout, so as to reset the integrated circuits 1 and 2 without an external reset circuit or manual reset upon detecting voltage instability or a human error or entering the power saving mode, saving manufacturing costs while eliminating system abnormalities in all operation modes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit comprising:
   a power-on reset (POR) circuit configured to receive an input voltage to generate a power-on reset signal and generate a clock signal;
   a watchdog timer coupled to the POR circuit, and configured to generate a timeout signal according to the clock signal upon receiving an enabling voltage, the clock signal enabling generation of timeout pulses in the timeout signal at predetermined time intervals;
   a first AND gate comprising:
      a first input terminal coupled to the POR circuit;
      a second input terminal coupled to the watchdog timer; and
      an output terminal configured to output a reset signal according to at least the power-on reset signal and the timeout signal; and
   a power management control circuit coupled to the first AND gate, and configured to reset an output current in response to a reset pulse in the reset signal.

2. The integrated circuit of claim 1, wherein:
   the POR circuit is further configured to generate a supply voltage according to the input voltage, and provide the supply voltage to the watchdog timer and the power management control circuit for power supply.

3. The integrated circuit of claim 2, wherein in a power-saving mode, the POR circuit is configured to continuously provide the supply voltage to the watchdog timer and the power management control circuit, and continuously output the clock signal to the watchdog timer.

4. The integrated circuit of claim 1, wherein the POR circuit is configured to switch the power-on reset signal to the enabling voltage when the input voltage exceeds a predetermined voltage level.

5. The integrated circuit of claim 1, further comprising an inverter comprising:
   an input terminal coupled to the watchdog timer and configured to receive the timeout signal; and
   an output terminal coupled to the second input terminal of the first AND gate and configured to output an inverted signal of the timeout signal.

6. The integrated circuit of claim 1, further comprising:
   a brown-out detection (BOD) circuit configured to receive the input voltage to generate a BOD signal; and
   a second AND gate comprising:
      a first input terminal coupled to the power-on reset circuit and configured to receive the power-on reset signal;
      a second input terminal coupled to the BOD circuit and configured to receive the BOD signal; and
      an output terminal configured to output an enabling signal according to the power-on reset signal and the BOD signal;
   wherein the watchdog timer is coupled to the output terminal of the second AND gate, and configured to generate the timeout signal according to the clock signal when the enabling signal has the enabling voltage; and
   the first input terminal of the first AND gate is coupled to the output terminal of the second AND gate and configured to receive the enabling signal.

7. The integrated circuit of claim 6, wherein the BOD circuit is configured to switch the BOD signal to the enabling voltage when the input voltage exceeds a first voltage level.

8. The integrated circuit of claim 6, wherein:
   the POR circuit is further configured to generate a supply voltage according to the input voltage, and provide the supply voltage to the watchdog timer and the power management control circuit for power supply.

9. The integrated circuit of claim 8, wherein in a power-saving mode, the POR circuit is configured to continuously provide the supply voltage to the watchdog timer and the power management control circuit, and continuously output the clock signal to the watchdog timer.

10. The integrated circuit of claim 6, wherein the POR circuit is configured to switch the power-on reset signal to the enabling voltage when the input voltage exceeds a second voltage level.

11. The integrated circuit of claim 6, further comprising an inverter comprising:
    an input terminal coupled to the watchdog timer and configured to receive the timeout signal; and
    an output terminal coupled to the second input terminal of the first AND gate and configured to output an inverted signal of the timeout signal.

12. The integrated circuit of claim 1, wherein the watchdog timer is configured to generate the timeout signal according to the clock signal when the power-on reset signal has the enabling voltage.

* * * * *